US010020735B2

(12) United States Patent
Le Men et al.

(10) Patent No.: US 10,020,735 B2
(45) Date of Patent: Jul. 10, 2018

(54) EFFICIENT MULTI-MODE DC-DC CONVERTER

(71) Applicant: SEMICONDUCTOR COMPONENTS INDUSTRIES, LLC, Phoenix, AZ (US)

(72) Inventors: Berengere Le Men, Tournefeuille (FR); Stephane Ramond, Quin-Fonsegrives (FR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/873,406

(22) Filed: Oct. 2, 2015

(65) Prior Publication Data

US 2016/0294285 A1 Oct. 6, 2016

Related U.S. Application Data

(60) Provisional application No. 62/142,823, filed on Apr. 3, 2015.

(51) Int. Cl.
*H02M 1/08* (2006.01)
*H02M 3/158* (2006.01)

(52) U.S. Cl.
CPC ............ *H02M 3/1582* (2013.01); *H02M 1/08* (2013.01); *H03K 2217/0081* (2013.01)

(58) Field of Classification Search
CPC .................. H02M 3/1582; H02M 1/08; H03K 2217/0081; H03K 17/06; H03K 17/063
See application file for complete search history.

(56) References Cited

U.S. PATENT DOCUMENTS 6,331,748 B1\* 12/2001 Hong .................... H01L 41/044
310/318
9,774,322 B1\* 9/2017 Duduman ............ H03K 17/223
(Continued)

OTHER PUBLICATIONS

G. Jin et al., "An Integrated Tri-mode Non-inverting Buck-Boost DC-DC Converter with Segmented Power Devices and Power Transmission Gate Structure," Proceedings of the 26th International Symposium on Power Semiconductor Devices & IC's, Jun. 2014, pp. 201-204.
(Continued)

*Primary Examiner* — Harry Behm
(74) *Attorney, Agent, or Firm* — Polansky & Associates, P.L.L.C.; Paul J. Polansky (57) ABSTRACT

In one form, a multi-mode converter includes first, second, third, and fourth transistors having respective control terminals and arranged in a four-switch buck-boost (FSBB) configuration for coupling to an inductor. The multi-mode converter also includes a first driver having an input for receiving a first switching signal and an output, a first charge pump having an output, a second driver having an input for receiving a second switching signal and an output, a second charge pump having an output, and a control circuit. The control circuit alternatively couples an output of the first driver or an output of the first charge pump to the control terminal of the first transistor, and the output of the second driver or the output of the second charge pump to the control terminal of the fourth transistor in response to a mode of operation of the multi-mode power converter.

20 Claims, 5 Drawing Sheets

(56) References Cited

U.S. PATENT DOCUMENTS

| | | | |
|---|---|---|---|
| 2008/0068869 A1* | 3/2008 | Shimizu | H02M 3/1582 363/25 |
| 2013/0187626 A1* | 7/2013 | Su | H02M 3/158 323/311 |
| 2014/0021932 A1* | 1/2014 | Ejury | G05F 3/02 323/311 |
| 2014/0217959 A1* | 8/2014 | Chen | H02J 7/0052 320/107 |

OTHER PUBLICATIONS

Linear Technology Corporation, "LTC3531/LTC3531-3.3/LTC3531-3, 200mA Buck-Boost Synchronous DC/DC Converters," Data Sheet, LT 0807 Rev B, Mar. 2006, 16 pages.

Intersil Corporation, "ISL91110, High Efficiency Buck-Boost Regulator with 4.5A Switches," Data Sheet, FN8434.2, Oct. 2014, 12 pages.

Texas Instruments, "TPS63000, TPS63001, TPS63002, High Efficient Single Inductor Buck-Boost Converter With 1.8-A Switches," Data Sheet, SLVS520B, Mar. 2006, Revised Jul. 2008, 24 pages.

Texas Instruments, "TPS63020, TPS63021, High Efficiency Single Inductor Buck-Boost Converter With 4-A Switches," Data Sheet, SLVS916C, Jul. 2010, Revised Mar. 2013, 29 pages.

\* cited by examiner

EFFICIENT MULTI-MODE DC-DC CONVERTER

This application claims priority to U.S. Provisional Application No. 62/142,823, filed on Apr. 3, 2015, entitled "Efficient Multi-Mode DC-DC Converter," invented by Berengere Le Men and Stephane Ramond.

FIELD OF THE DISCLOSURE

The present disclosure relates generally to power conversion circuits, and more particularly to DC-DC converters.

BACKGROUND

Low voltage DC-DC converters are useful for power management in battery powered portable electronic devices such as smartphones, tablets, wearable products, etc. DC-DC converters convert a direct current (DC) input voltage into a different DC output voltage. If the DC-DC converter raises the input voltage, then it is known as a boost converter, whereas if it lowers the input voltage, then it is known as a buck converter. If it is capable of operating in either buck mode or boost mode, it is known as a buck-boost converter.

Because the battery voltage of a portable electronic device may vary over a relatively large range, multi-mode buck-boost DC-DC converters have become popular. The most popular multi-mode converter topology is known as the Four Switch Buck Boost Converter (FSBBC) that uses two power switches connected to each terminal of an inductor, one switch on the high side and one switch on the low side of each inductor terminal. During both buck and boost modes of operation, one high-side switch (HSS) remains continuously conductive. For example when operating in the boost mode, the HSS on the input side of the inductor is continuously conductive. Alternatively when operating in the buck mode, the HSS on the output side is continuously conductive. Since the amount of load current is significant and can be, for example, on the order or several amperes, the losses caused by the on resistance ($R_{ON}$) of the HSS that is continuously conductive reduces the efficiency of the converter and shortens battery life.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
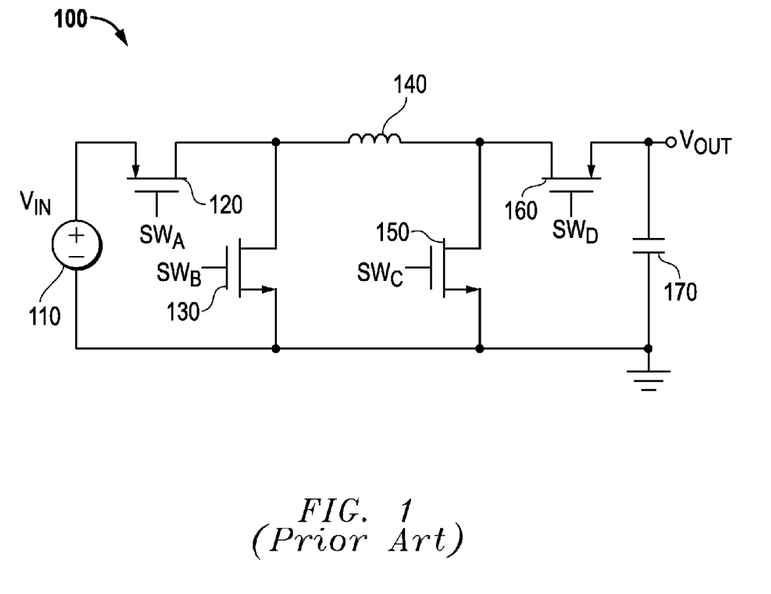
FIG. 1 illustrates in schematic form a multi-mode converter known in the prior art.

FIG. 1 illustrates in schematic form a multi-mode converter 100 known in the prior art. Multi-mode converter 100 is an FSBBC and includes a voltage source 110, a P-channel metal-oxide-semiconductor (MOS) transistor 120, an N-channel MOS transistor 130, an inductor 140, an N-channel MOS transistor 150, a P-channel MOS transistor 160, and a capacitor 170.

Voltage source 110 has a positive terminal for providing a DC input voltage labeled "$V_{IN}$", and a negative terminal connected to ground. $V_{IN}$ could be, for example, in the range from about 2.0 volts to about 5.0 volts with respect to ground at 0.0 volts. In one form, voltage source 110 is a battery that is fully charged at about 5.0 volts.

Transistor 120 has a source connected to the positive terminal of voltage source 110, a gate for receiving a first switching signal labeled "$SW_A$", and a drain. Transistor 130 has a drain connected to the drain of transistor 120, a gate for receiving a second switching signal labeled "$SW_B$", and a source connected to ground. Inductor 140 has a first terminal connected to the drains of transistors 120 and 130, and a second terminal. Transistor 150 has a drain connected to the second terminal of inductor 140, a gate for receiving a third switching signal labeled "$SW_C$", and a source connected to ground. Transistor 160 has a source for providing an output voltage "$V_{OUT}$", a gate for receiving a fourth switching signal labeled "$SW_D$", and a drain connected to the second terminal of inductor 140.

Capacitor 170 has a first terminal connected to the source of transistor 160, and a second terminal connected to ground. Transistors 120, 130, 150, and 160 are power MOS transistors that can be fabricated on a single integrated circuit chip. However inductor 140 and capacitor 170 typically have large values and are not implemented on the same integrated circuit chip as transistors 120, 130, 150, and 160.

In operation, multi-mode converter 100 is able to operate in the buck, boost, or buck-boost mode based on the magnitude of $V_{IN}$. A controller (not shown in FIG. 1) controls the switching of each MOS transistor to regulate $V_{OUT}$ to a desired value. In the buck mode, $V_{IN} > V_{OUT}$, transistor 160 is conductive, transistor 150 is non-conductive, and the controller switches transistors 120 and 130 to regulate $V_{OUT}$ to the desired level. In the boost mode, $V_{IN} <$ transistor 120 is conductive, transistor 130 is non-conductive, and the controller switches transistors 150 and 160 to regulate $V_{OUT}$ to the desired level. In the buck-boost mode, $V_{IN} \approx V_{OUT}$, and the controller switches transistors 120, 130, 150, and 160 to regulate $V_{OUT}$ to the desired level. The controller also includes comparators to compare input voltage $V_{IN}$ to output voltage $V_{OUT}$ to determine the mode of operation.

Transistors 120, 130, 150, and 160 are large power MOS transistors that may conduct currents, for example, on the order of several amperes. In order to increase converter efficiency at high load current, the on resistance ($R_{ON}$) of the HSS transistor that is continuously conductive (transistor 160 in buck mode and transistor 120 in boost mode) should be as low as possible. However, $R_{ON}$ increases at low gate-to-source voltages, which leads to higher conduction loss and decreased efficiency in the buck or boost modes.

Figure 2:
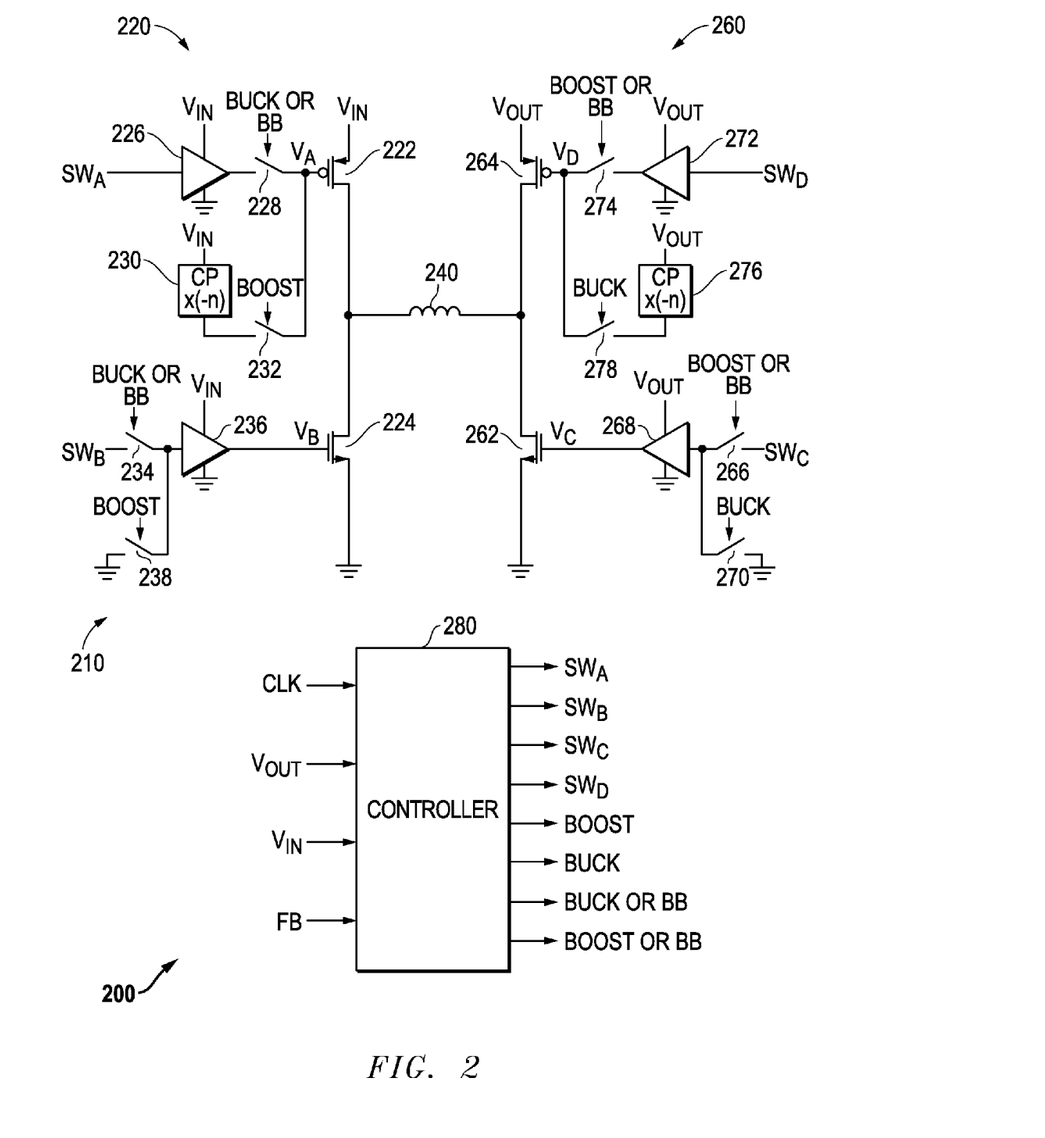
FIG. 2 illustrates in partial block diagram and partial schematic form a multi-mode converter according to a first embodiment.

FIG. 2 illustrates in partial block diagram and partial schematic form a multi-mode converter 200 according to a first embodiment. Multi-mode converter 200 is an FSBBC that includes generally a converter portion 210 and a controller 280. Converter portion 210 includes generally a buck converter portion 220, an inductor 240, and a boost converter portion 260.

Buck converter portion 220 includes a P-channel MOS transistor 222, an N-channel MOS transistor 224, a driver 226, a switch 228, a charge pump 230, a switch 232, a switch 234, a driver 236, and a switch 238. Transistor 222 has a source for receiving input voltage $V_{IN}$, a gate for receiving a voltage labeled "$V_A$", and a drain. Transistor 224 has a drain connected to the drain of transistor 222, a gate for receiving a voltage labeled "$V_B$", and a source connected to ground. Driver 226 has an input for receiving first switching signal $SW_A$, an output, a positive power supply terminal for receiving input voltage $V_{IN}$, and a negative power supply terminal connected to ground. Switch 228 has a first terminal connected to the output of driver 226, a second terminal connected to the gate of transistor 222, and a control terminal for receiving a control signal labeled "BUCK OR BB". Charge pump 230 has an input for receiving input voltage $V_{IN}$, and an output. Switch 232 has a first terminal connected to the output of charge pump 230, a second terminal connected to the gate of transistor 222, and a control terminal for receiving a control signal labeled "BOOST". Switch 234 has a first terminal for receiving second control signal $SW_B$, a second terminal, and a control terminal for receiving control signal BUCK OR BB. Driver 236 has an input connected to the second terminal of switch 234, an output connected to the gate of transistor 224, a positive power supply terminal for receiving input voltage $V_{IN}$, and a negative power supply terminal connected to ground. Switch 238 has a first terminal connected to ground, a second terminal connected to the input of driver 236, and a control terminal for receiving control signal BOOST.

Inductor 240 has a first terminal connected to the drains of transistors 222 and 224, and a second terminal.

Boost converter portion 260 includes an N-channel MOS transistor 262, a P-channel MOS transistor 264, a switch 266, a driver 268, a switch 270, a driver 272, a switch 274, a charge pump 276, and a switch 278. Transistor 262 has a drain connected to the second terminal of inductor 240, a gate for receiving a voltage labeled "$V_C$", and a source connected to ground. Transistor 264 has a source for providing output voltage $V_{OUT}$, a gate for receiving a voltage labeled "$V_D$", and a drain connected to the drain of transistor 262 and to the second terminal of inductor 240. Switch 266 has a first terminal for receiving third switching signal $SW_C$, a second terminal, and a control terminal for receiving a control signal labeled "BUCK OR BB". Driver 268 has an input connected to the second terminal of switch 266, an output connected to the gate of transistor 262, a positive power supply terminal for receiving output voltage $V_{OUT}$, and a negative power supply terminal connected to ground. Switch 270 has a first terminal connected to ground, a second terminal connected to the input of driver 268, and a control terminal for receiving a control signal labeled "BUCK". Driver 272 has an input for receiving fourth switching signal $SW_D$, an output, a positive power supply terminal for receiving output voltage $V_{OUT}$, and a negative power supply terminal connected to ground. Switch 274 has a first terminal connected to the output of driver 272, a second terminal connected to the gate of transistor 264, and a control terminal for receiving control signal BOOST OR BB. Charge pump 276 has an input for receiving output voltage $V_{OUT}$, and an output. Switch 278 has a first terminal connected to the output of charge pump 276, a second terminal connected to the gate of transistor 264, and a control terminal for receiving control signal BUCK.

Controller 280 has a first input for receiving a clock signal labeled "CLK", a second input for receiving output voltage $V_{OUT}$, a third input for receiving input voltage $V_{IN}$, a fourth input for receiving a feedback signal labeled "FB", a set of switching signal outputs for providing switching signals $SW_A$, $SW_B$, $SW_C$, and $SW_D$, and a set of control outputs for providing control signals BOOST, BUCK, BUCK OR BB, and BOOST OR BB. Note that the CLK input may be omitted if controller 280 is self-oscillating or is a ripple-based controller.

In operation, multi-mode power converter 200 operates in one of three modes: buck, boost, and buck-boost. Controller 280 selects the mode of operation based on the relationship between $V_{IN}$ and $V_{OUT}$. In the buck mode, $V_{IN} > V_{OUT}$. Transistor 264 is continuously conductive, transistor 262 is continuously non-conductive, and controller 280 switches transistors 222 and 224 to regulate $V_{OUT}$ to the desired level based on feedback signal FB. More particularly, controller 280 activates control signal BUCK OR BB, which closes switches 228 and 234 and causes transistors 222 and 224 to switch based on switching signals $SW_A$ and $SW_B$, respectively. Controller 280 changes the duty cycle of switching signals $SW_A$ and $SW_B$ based on feedback signal FB to regulate $V_{OUT}$ to a desired level. Controller 280 also activates control signal BUCK to close switch 270, connecting the input of driver 268 to ground. Driver 268 in turn provides a low voltage to the gate of transistor 262, keeping transistor 262 non-conductive. Control signal BUCK also closes switch 278, connecting the output of charge pump 276 to the gate of transistor 264. Charge pump 276 is a negative charge pump that provides a voltage on its output voltage according to the following relationship:

$$V_D = (-n) * V_{OUT} \quad [1]$$

in which the gain of charge pump 276 is equal to −n. The absolute value of the gate-to-source voltage (VGS) of transistor 264, $VGS_D$, can be expressed as follows:

$$|VGS_D| = (n+1) * V_{OUT} \quad [2]$$

Thus charge pump 276 provides an enhanced DC bias voltage to the gate of transistor 264 when it is continuously conductive in buck mode. This enhanced DC bias voltage reduces the $R_{ON}$, improving efficiency at low $V_{OUT}$.

In the boost mode, $V_{IN} < V_{OUT}$. Transistor 222 is continuously conductive, transistor 224 is continuously non-conductive, and controller 280 switches transistors 262 and 264 to regulate $V_{OUT}$ to the desired level based on feedback signal FB. More particularly, controller 280 activates control signal BOOST OR BB, which closes switches 266 and 274 and causes transistors 262 and 264 to switch based on switching signals $SW_C$ and $SW_D$, respectively. Controller 280 changes the duty cycle of switching signals $SW_C$ and $SW_D$ based on feedback signal FB to regulate $V_{OUT}$ to the desired level. Controller 280 also activates control signal BOOST to close switch 238, connecting the input of driver 236 to ground. Driver 236 in turn provides a low voltage to the gate of transistor 224, keeping transistor 224 non-conductive. Control signal BOOST also closes switch 232, connecting the output of charge pump 230 to the gate of transistor 222. Charge pump 230 is also a negative charge pump that provides a voltage on its output voltage according to the following relationship:

$$V_A = (-n) * V_{IN} \quad [3]$$

in which the gain of charge pump 230 is again equal to −n. The absolute value of the VGS of transistor 222, $VGS_A$, can be expressed as follows:

$$|VGS_A|=(n+1)*V_{IN} \quad [4]$$

Thus charge pump 230 provides an enhanced DC bias voltage to the gate of transistor 222 when it is continuously conductive in boost mode. This enhanced DC bias reduces the $R_{ON}$ of transistor 222, improving efficiency at low $V_{IN}$.

Charge pumps 230 and 276 may be implemented with any of a variety of known charge pump circuits. The gain of charge pumps 230 and 276 may be chosen to make $|VGS_A|$ and $|VGS_D|$ as large as possible without causing breakdown or gate rupture of transistors 222 and 264, respectively. Multi-mode converter 200 may also include Zener diodes connected between the gate and source terminals of transistors 222 and 264 to function as voltage clamps to ensure $|VGS_A|$ and $|VGS_D|$ never reach their respective breakdown levels. However making $|VGS_A|$ and $|VGS_D|$ larger than the Zener diode breakdown voltages reduces power conversion efficiency.

In the buck-boost mode, $V_{IN} \approx V_{OUT}$. Controller 280 closes switches 228, 234, 266, and 274 to dynamically provide switching signals SWA, SWB, SWC, and SWD to the gates of their respective transistors 222, 224, 262, and 264 to regulate $V_{OUT}$ to the desired level based on feedback signal FB.

TABLE I below summarizes the operation of multi-mode power converter 200 in the various modes:

TABLE I

| | Mode: | | |
|---|---|---|---|
| Condition: | Buck $V_{IN} > V_{OUT}$ | Boost $V_{IN} < V_{OUT}$ | Buck-Boost $V_{IN} \approx V_{OUT}$ |
| Transistor 222 | Conductive at duty cycle determined by FB | Continuously conductive using charge pumped voltage | Conductive at duty cycle determined by FB |
| Transistor 224 | Conductive at duty cycle determined by FB | Continuously non-conductive | Conductive at duty cycle determined by FB |
| Transistor 264 | Continuously conductive using charge pumped voltage | Conductive at duty cycle determined by FB | Conductive at duty cycle determined by FB |
| Transistor 262 | Continuously non-conductive | Conductive at duty cycle determined by FB | Conductive at duty cycle determined by FB |

Figure 3:
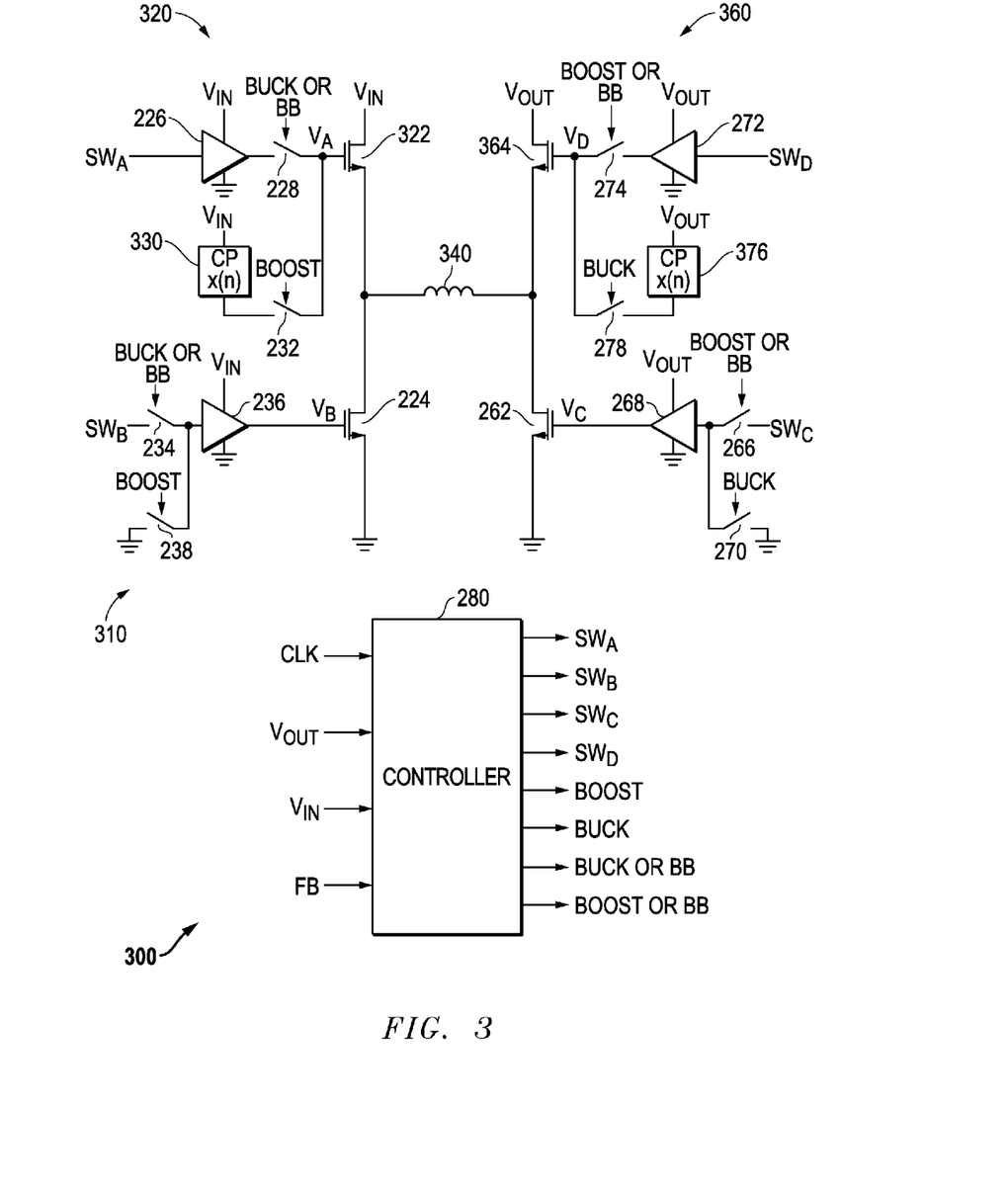
FIG. 3 illustrates in partial block diagram and partial schematic form a multi-mode converter according to a second embodiment.

FIG. 3 illustrates in partial block diagram and partial schematic form a multi-mode converter 300 according to a second embodiment. Multi-mode converter 300 is similar to multi-mode converter 200 of FIG. 2 and corresponding elements are labeled similarly. The difference between multi-mode converter 300 and multi-mode converter 200 is that multi-mode converter 300 has a converter portion 310 having a buck portion 320 using an N-channel MOS transistor 322 in place of P-channel MOS transistor 222 and a boost portion 360 using an N-channel MOS transistor 364 in place of P-channel MOS transistor 264. In order to accommodate the difference in polarity of the HSS transistors, buck portion 320 uses a positive charge pump 330 in place of negative charge pump 230, and boost portion 360 uses a positive charge pump 376 in place of negative charge pump 276.

In the buck mode, $V_{IN} > V_{OUT}$, transistor 364 is continuously conductive, transistor 262 is continuously non-conductive, and controller 280 switches transistors 322 and 224 to regulate $V_{OUT}$ to the desired level based on feedback signal FB. More particularly, controller 280 activates control signal BUCK OR BB, which closes switches 228 and 234 and causes transistors 322 and 224 to switch based on switching signals $SW_A$ and $SW_B$, respectively. Controller 280 changes the duty cycle of switching signals $SW_A$ and $SW_B$ based on feedback signal FB to regulate $V_{OUT}$ to the desired level. Controller 280 also activates control signal BUCK to close switch 270, connecting the input of driver 268 to ground. Driver 268 in turn provides a low voltage on its output, keeping transistor 262 non-conductive. Control signal BUCK also closes switch 278, connecting the output of charge pump 376 to the gate of transistor 364. Charge pump 376 is a positive charge pump that provides a voltage on its output according to the following relationship:

$$V_D=(n)*V_{OUT} \quad [5]$$

in which the gain of charge pump 376 is equal to n. The absolute value of the gate-to-source voltage (VGS) of transistor 364, $VGS_D$, can be expressed as follows:

$$|VGS_D|=(n-1)*V_{OUT} \quad [6]$$

Thus charge pump 376 provides an enhanced DC bias voltage to the gate of transistor 364 when it is continuously closed in buck mode. This enhanced DC bias reduces the $R_{ON}$ of transistor 364, improving efficiency at low $V_{OUT}$.

In the boost mode, $V_{IN} < V_{OUT}$, transistor 222 is continuously conductive, transistor 224 is continuously non-conductive, and controller 280 switches transistors 262 and 264 to regulate $V_{OUT}$ to the desired level based on feedback signal FB. More particularly, controller 280 activates control signal BOOST OR BB, which closes switches 266 and 274 and causes transistors 262 and 264 to switch based on switching signals $SW_C$ and $SW_D$, respectively. Controller 280 changes the duty cycle of switching signals $SW_C$ and $SW_D$ based on feedback signal FB to regulate $V_{OUT}$ to a desired level. Controller 280 also activates control signal BOOST to close switch 238, connecting the input of driver 236 to ground. Driver 236 in turn provides a low voltage on its output, keeping transistor 224 non-conductive. Control signal BOOST also closes switch 232, connecting the output of charge pump 330 to the gate of transistor 222. Charge pump 330 is also a positive charge pump that provides a voltage on its output according to the following relationship:

$$V_A=(n)*V_{IN} \quad [7]$$

in which the gain of charge pump 330 is again equal to n. The absolute value of the VGS of transistor 322, $VGS_A$, can be expressed as follows:

$$|VGS_A|=(n-1)*V_{IN} \quad [8]$$

Thus charge pump 330 provides an enhanced DC bias voltage to the gate of transistor 322 when it is continuously conductive in boost mode. This enhanced DC bias reduces the $R_{ON}$ of transistor 322, improving efficiency at low $V_{IN}$.

Figure 4:
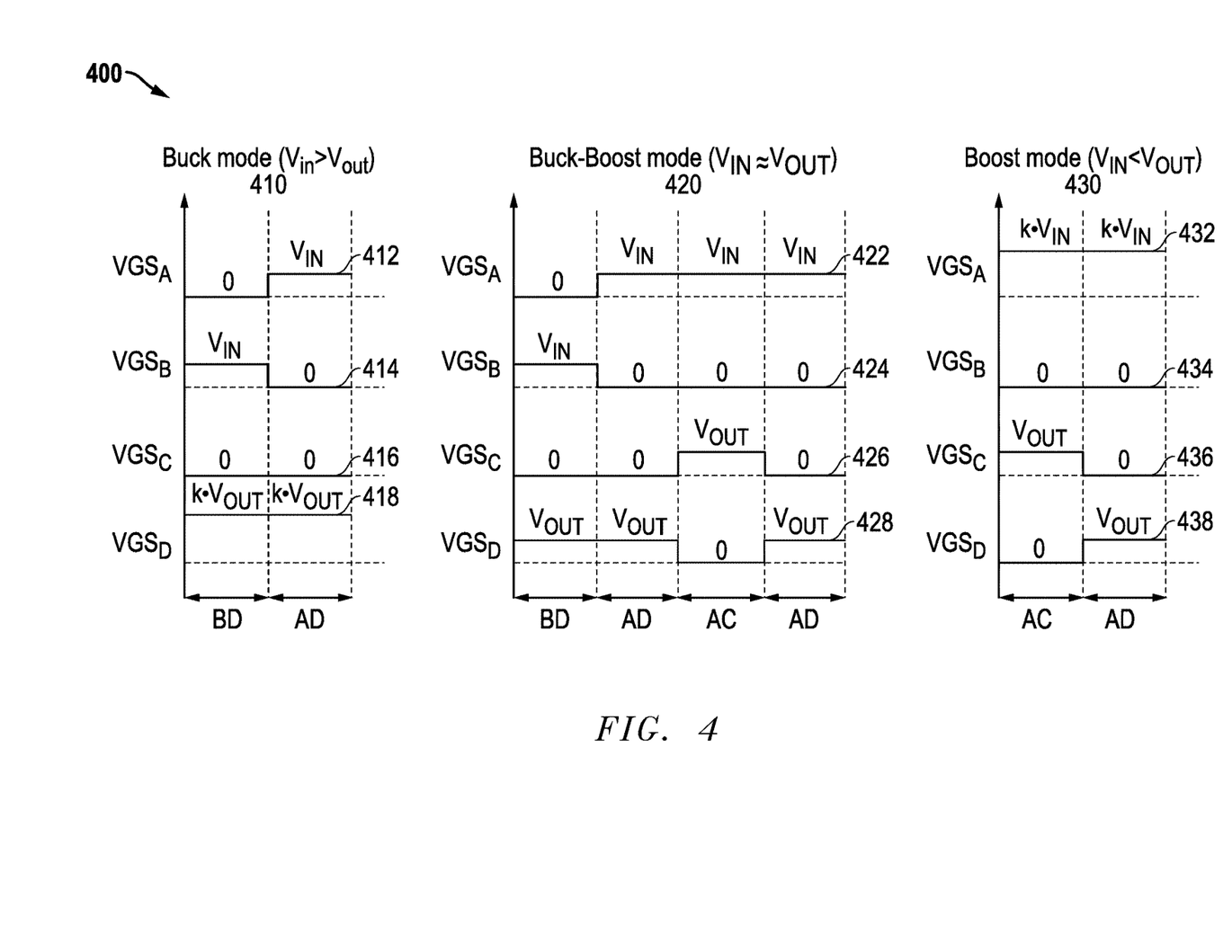
FIG. 4 illustrates a timing diagram of the sequencing of drive signals of the multi-mode converters of FIGS. 2 and 3.

FIG. 4 illustrates a timing diagram 400 of the sequencing of drive signals of the multi-mode converters of FIGS. 2 and 3. In timing diagram 400 the horizontal axis represents time in a suitable unit such as microseconds, and the vertical axis represents the voltage of various signals in volts. Timing diagram 400 includes a buck mode portion 410 for buck mode operation when $V_{IN} > V_{OUT}$, a buck-boost mode portion 420 for buck-boost mode operation in which $V_{IN} \approx V_{OUT}$, and a boost mode portion 430 for boost mode operation in which $V_{IN} < V_{OUT}$. Timing diagram 400 illustrates the absolute value of the gate-to-source voltage of the A, B, C, and D switches, namely $|VGS_A|$, $|VGS_B|$, $|VGS_C|$, and $|VGS_D|$, respectively, but are labeled simply as $VGS_A$, $VGS_B$, $VGS_C$, and $VGS_D$ in FIG. 4.

In buck mode portion 410 of timing diagram 400, the $|VGS_A|$, $|VGS_B|$, $|VGS_C|$, and $|VGS_D|$ signals are shown as waveforms 412, 414, 416, and 418, respectively. Controller 280 provides this set of signals in two phases, including a first phase known as the "BD" phase in which switches B and D are conductive, and a second phase known as the "AD" phase in which switches A and D are conductive. The two phases are separated by a dashed line. In the BD phase, $|VGS_A|$ is equal to 0 volts and thus the A transistor is nonconductive, while $|VGS_B|$ is equal to $V_{IN}$ and thus the B transistor is conductive. In the AD phase, controller 280 reverses the drive signals to the A and B transistors by driving $|VGS_A|$ to $V_{IN}$ to make the A transistor conductive, and $|VGS_B|$ to 0 volts to make the B transistor nonconductive. The C transistor is not used in buck mode and thus controller 280 drives $|VGS_C|$ continually to 0 volts to make the C transistor nonconductive. However controller 280 connects the D charge pump to the gate of the D transistor to continually bias the D transistor to $|VGS_D|$ of $k*V_{OUT}$. The value of k depends on whether P-channel HSS transistors are used (as in FIG. 2) or N-channel HSS transistors used (as in FIG. 3). For multi-mode converter 200 of FIG. 2, k=n+1 wherein for multi-mode converter 300, k=n−1. This boosted voltage reduces $R_{ON}$ and thus IR losses through transistor D.

In boost mode portion 430, the $|VGS_A|$, $|VGS_B|$, $|VGS_C|$, and $|VGS_D|$ signals are shown as waveforms 432, 434, 436, and 438, respectively. Controller 280 provides this set of signals in two phases, including a first phase known as the "AC" phase in which switches A and C are conductive, and a second phase known as the "AD" phase in which switches A and D are conductive. The two phases are once again separated by a dashed line. In the AC phase, $|VGS_D|$ is equal to 0 volts and thus the D transistor is nonconductive, while $|VGS_C|$ is equal to $V_{OUT}$ and thus the C transistor is conductive. In the AD phase, controller 280 reverses the drive signals to the C and D transistors by driving $VGS_C$ to 0 volts to make the C transistor nonconductive, and $|VGS_D|$ to $V_{OUT}$ to make the D transistor nonconductive. The B transistor is not used in boost mode and thus controller 280 drives $|VGS_B|$ continually to 0 volts to make the B transistor nonconductive. However controller 280 connects the A charge pump to the gate of the A transistor to continually bias the A transistor to $|VGS_A|$ of $k*V_{IN}$. This boosted voltage reduces $R_{ON}$ and thus IR losses through transistor A.

In buck-boost mode portion 420, the $|VGS_A|$, $|VGS_B|$, $|VGS_C|$, and $|VGS_D|$ signals are shown as waveforms 422, 424, 426, and 428, respectively. In this example, controller 280 provides this set of signals in four phases, including a first BD phase in which switches B and D are conductive, a second AD phase in which switches A and D are conductive, a third AC phase in which switches A and C are conductive, and a fourth AD phase in which switches A and D are conductive. Controller 280 drives all transistors with a $V_{GS}$ of 0 volts when nonconductive, transistors A and B with a $V_{GS}$ of $V_{IN}$ when conductive, and transistors C and D with a $V_{GS}$ of $V_{OUT}$ when conductive. The switching sequence of multi-mode converter 200 in buck-boost mode is exemplary, and moreover there are no phases in which controller 280 uses a charge pump to reduce $R_{ON}$. In other embodiments, the multi-mode converter as disclosed herein may omit the buck-boost mode and support only buck mode and boost mode.

The variable k is chosen to be at a desired voltage for the particular design taking according to the breakdown voltage of the transistor in the particular manufacturing process. Thus for example k can be made as high as possible as long as $k*V_{OUT}$ is less than the breakdown voltage. In order to protect the HSS from breakdown, in some embodiments a Zener diode can be connected between the gate and source of the HSS to avoid the need to precisely control k for all process variations.

Figure 5:
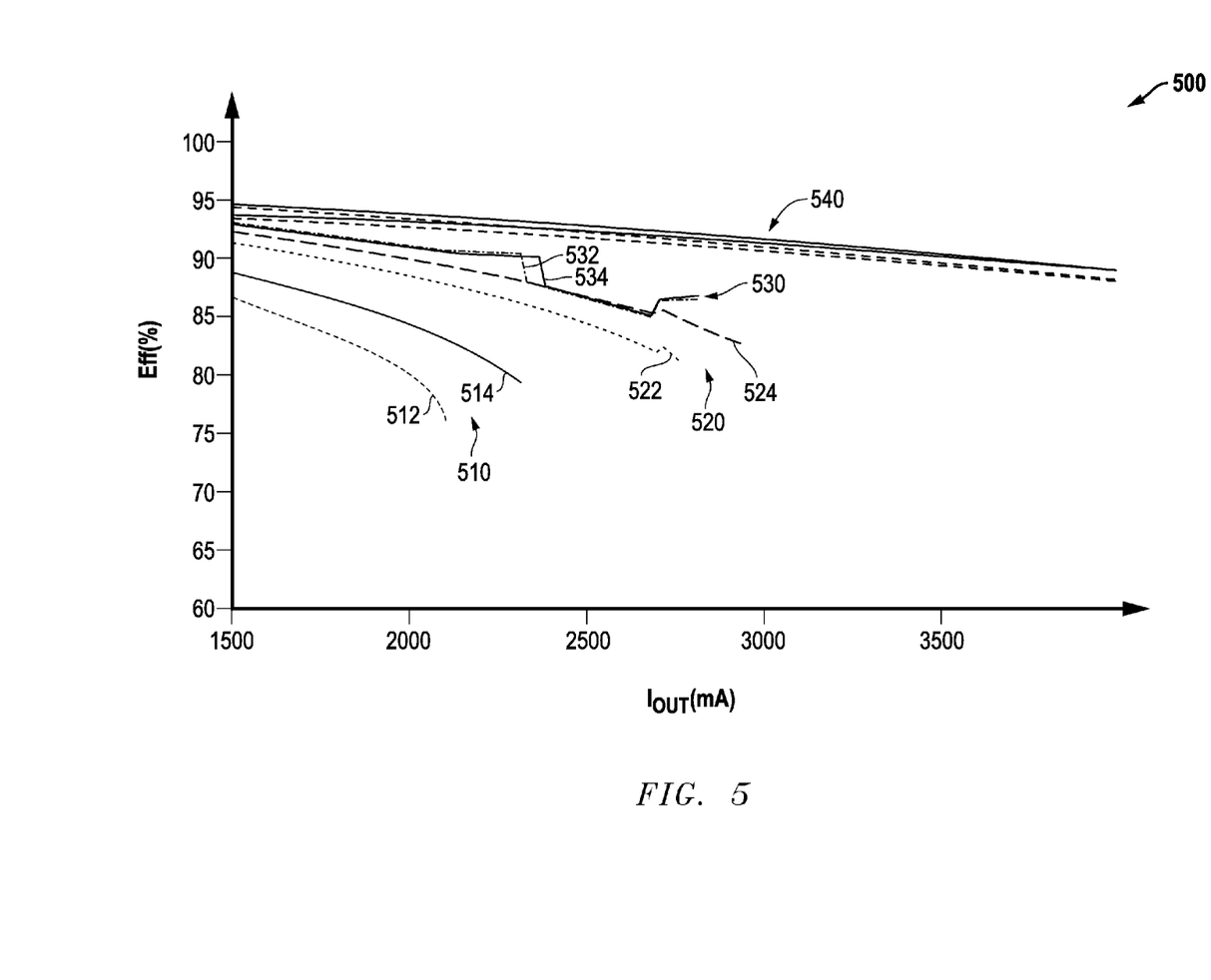
FIG. 5 illustrates a graph showing the power conversion efficiency of the multi-mode converters of FIGS. 2 and 3 for different input voltages.

FIG. 5 illustrates a graph 500 showing the power conversion efficiency of the boost-buck converters of FIGS. 2 and 3 for different input voltages. In graph 500, the horizontal axis represents output current $I_{OUT}$ in milliamperes (mA), and the vertical axis represents the converter efficiency in percentage. In this example, $V_{OUT}$ is set to 3.3 volts.

A first set of waveforms 510 represents the measured power conversion efficiency for $V_{IN}$=2.35 volts and includes waveforms 512 and 514. Waveform 512 represents the power conversion efficiency without charge pumping enabled, whereas waveform 514 represents the power conversion efficiency with charge pumping enabled. It can be seen from set of waveforms 510 that power conversion efficiency increases between about 2% and about 5%.

A second set of waveforms 520 represents the measured power conversion efficiency for $V_{IN}$=2.8 volts and includes waveforms 522 and 524. Waveform 522 represents the power conversion efficiency without charge pumping enabled, whereas waveform 514 represents the power conversion efficiency with charge pumping enabled. It can be seen from set of waveforms 520 that power conversion efficiency increases between about 1% and about 3.5%.

A third set of waveforms 530 represents the measured power conversion efficiency for $V_{IN}$=3.3 volts and includes waveforms 532 and 534. Waveform 532 represents the power conversion efficiency without charge pumping enabled, whereas waveform 534 represents the power conversion efficiency with charge pumping enabled. It can be seen from set of waveforms 530 that power conversion efficiency improves slightly with the use of charge pumping.

A fourth set of substantially coincident waveforms 540 represents the power conversion efficiency for $V_{IN}$=4.2 volts and 5.5 volts. Waveforms 540 illustrate that there is only slight improvement in power conversion efficiency at these higher voltages.

Thus a multi-mode converter according to the disclosed embodiments provides higher power conversion efficiency that increases at higher load current for low $V_{IN}$ (in boost mode) and low $V_{OUT}$ (in buck mode). The multi-mode converter can also achieve a higher current output at low voltages. Moreover the multi-mode converter according to the disclosed embodiments forms a cost-effective solution without additional external components or without a significant increase in integrated circuit die size. For example all the elements of either multi-mode converter 200 or multi-mode converter 300 can be combined in a single integrated circuit, except for inductor 240. The charge pumps can formed with only a small amount of circuit area, since they are not required to switch and therefore can gradually increase their output voltages when used. Moreover, they only require a few microamperes to maintain the gate voltage for continuously conductive transistors.

The above-disclosed subject matter is to be considered illustrative, and not restrictive, and the appended claims are intended to cover all such modifications, enhancements, and other embodiments that fall within the true scope of the claims. For example in various embodiments, only N-channel transistors could be used, whereas in other embodiments both N- and P-channel transistors could be used. Moreover buck-boost operation is optional and could be eliminated in some embodiments. In various embodiments the output voltage control loop can be based on voltage mode control, current mode control, or a combination of voltage and current control. Also input voltage to the charge pump of the HSS connected to the second terminal of the inductor could be based on $V_{IN}$ instead of $V_{OUT}$, although the use of $V_{OUT}$ is simpler. Moreover charge pumps 230 and 276 in FIGS. 2 and 330 and 376 of FIG. 3 were illustrated as being voltage multiplying charge pumps. In other embodiments, these charge pumps could increase or decrease their respective input voltages by certain offsets, as long as the offsets are compatible with the gate-to-source breakdown voltage of the transistors they drive.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A multi-mode power converter comprising:
   first, second, third, and fourth transistors having respective control terminals and arranged in a four-switch buck-boost (FSBB) configuration for coupling to an inductor;
   a first driver having an input for receiving a first switching signal and an output;
   a first charge pump having an output;
   a second driver having an input for receiving a second switching signal and an output;
   a second charge pump having an output; and
   a control circuit for alternatively coupling said output of said first driver or said output of said first charge pump to said control terminal of said first transistor, and said output of said second driver or said output of said second charge pump to said control terminal of said fourth transistor in response to a mode of operation of the multi-mode power converter,
   wherein in a first mode, said control circuit couples said output of said first charge pump to said control terminal of said first transistor and said second switching signal to said control terminal of said fourth transistor, and in a second mode, said control circuit couples said output of said second charge pump to said control terminal of said fourth transistor and said first switching signal to said control terminal of said first transistor.

2. The multi-mode power converter of claim 1 wherein said first and fourth transistors comprise P-channel MOS transistors and said second and third transistors comprise N-channel MOS transistors.

3. The multi-mode power converter of claim 2 wherein said first and second charge pumps comprise negative charge pumps.

4. The multi-mode power converter of claim 3 wherein said first transistor has a source for receiving an input voltage, said fourth transistor has a source for providing an output voltage, said first charge pump has an input for receiving said input voltage, and said second charge pump has an input for receiving said output voltage.

5. The multi-mode power converter of claim 1 wherein first, second, third, and fourth transistors comprise N-channel MOS transistors.

6. The multi-mode power converter of claim 5 wherein said first and second charge pumps comprise positive charge pumps.

7. The multi-mode power converter of claim 5 wherein said first transistor has a drain for receiving an input voltage, said fourth transistor has a drain for providing an output voltage, said first charge pump has an input for receiving said input voltage, and said second charge pump has an input for receiving said output voltage.

8. The multi-mode power converter of claim 1 wherein said control circuit comprises:
   a first switch coupled between said output of said first driver and said control terminal of said first transistor and conductive in response to a first control signal;
   a second switch coupled between said output of said first charge pump and said control terminal of said first transistor and conductive in response to a second control signal;
   a third switch coupled between said output of said second driver and said control terminal of said fourth transistor and conductive in response to a third control signal;
   a fourth switch coupled between said output of said second charge pump and said control terminal of said third transistor and conductive in response to a fourth control signal; and
   a controller for activating said first control signal in one of a buck mode and a buck-boost mode, said second control signal in a boost mode, said third control signal in one of said boost mode and said buck-boost mode, and said fourth control signal in said buck mode.

9. A control circuit for a multi-mode power converter comprising:
   first, second, third, and fourth voltage terminals adapted to be coupled to control terminals of corresponding first, second, third, and fourth transistors, respectively arranged in a four-switch buck-boost (FSBB) configuration for coupling to an inductor;
   a first driver having an input for receiving a first switching signal and an output;
   a first charge pump having an output;
   a second driver having an input for receiving a second switching signal and an output; and
   a second charge pump having an output,
   wherein the control circuit alternatively couples said output of said first driver or said output of said first charge pump to said first voltage terminal, and said output of said second driver or said output of said second charge pump to said fourth voltage terminal in response to a mode of operation of the multi-mode power converter,
   wherein in a first mode, the control circuit couples said output of said first charge pump to said control terminal of said first transistor and said second switching signal to said fourth voltage terminal, and in a second mode, said control circuit couples said output of said second charge pump to said fourth voltage terminal and said first switching signal to first voltage terminal.

10. The control circuit of claim 9 further comprising:
    a first switch coupled between said output of said first driver and said first voltage terminal and conductive in response to a first control signal; and
    a second switch coupled between said output of said first charge pump and said first voltage terminal and conductive in response to a second control signal.

11. The control circuit of claim 10 further comprising:
    a third switch coupled between said output of said second driver and said fourth voltage terminal and conductive in response to a third control signal; and
    a fourth switch coupled between said output of said second charge pump and said fourth voltage terminal and conductive in response to a fourth control signal.

12. The control circuit of claim 11 further comprising:
a fifth switch having a first terminal for receiving a third switching signal and a second terminal coupled to said second terminal, and conductive in response to said first control signal;
a sixth switch having a first terminal coupled to a reference voltage terminal and a second terminal coupled to said second terminal of said fifth switch, and conductive in response to said second control signal; and
a third driver having an input coupled to said second terminals of said fifth switch and said sixth switch, and an output coupled to said second terminal.

13. The control circuit of claim 12 further comprising:
a seventh switch having a first terminal for receiving a fourth switching signal and a second terminal, and conductive in response to said third control signal;
a eighth switch having a first terminal coupled to said reference voltage terminal and a second terminal coupled to said second terminal of said seventh switch, and conductive in response to said fourth control signal; and
a fourth driver having an input coupled to said second terminals of said seventh switch and said eighth switch, and an output coupled to said second terminal.

14. The control circuit of claim 11 further comprising:
a controller for activating said first control signal in one of a buck mode and a buck-boost mode, said second control signal in a boost mode, said third control signal in one of said boost mode and said buck-boost mode, and said fourth control signal in said buck mode.

15. The control circuit of claim 9 wherein said first and second charge pumps comprise negative charge pumps and said first and fourth voltage terminals are adapted to be coupled to first and second P-channel MOS transistors.

16. The control circuit of claim 9 wherein said first and second charge pumps comprise positive charge pumps and said first and fourth voltage terminals are adapted to be coupled to first and second N-channel MOS transistors.

17. A method of operating a four-switch buck-boost (FSBB) power converter with first, second, third, and fourth transistors having respective control terminals and arranged in a four-switch buck-boost (FSBB) configuration for coupling to an inductor comprising:
in a boost mode:
providing a first boosted voltage at an output of a first charge pump to said control terminal of said first transistor;
driving said control terminal of said second transistor to disable said second transistor;
driving said control terminal of said third transistor with a third switching signal; and
driving said control terminal of said fourth transistor with an output of a first driver that provides its output in response to a fourth switching signal, and
in a buck mode:
alternatively driving said control terminal of said first transistor with an output of a second driver that provides its output in response to a first switching signal;
driving said control terminal of said second transistor with a second switching signal;
disabling said control terminal of said third transistor to disable said third transistor; and
alternatively providing a second boosted voltage at an output of a second charge pump to said control terminal of said fourth transistor.

18. The method of claim 17 further comprising:
in a buck-boost mode:
driving said control terminals of said first, second, third, and fourth transistors with first, second, third, and fourth control signals, respectively.

19. The method of claim 17 wherein in said boost mode, providing said first boosted voltage to said control terminal of said first transistor using said first charge pump comprises charge pumping an input voltage of the FSBB power converter to provide said first boosted voltage.

20. The method of claim 17 wherein in said buck mode, providing said second boosted voltage to said control terminal of said fourth transistor using said second charge pump comprises charge pumping an output voltage of the FSBB power converter to provide said second boosted voltage.

* * * * *